(12) United States Patent
Emami-Neyestanak et al.

(10) Patent No.: US 10,819,384 B2
(45) Date of Patent: Oct. 27, 2020

(54) BI-DIRECTIONAL AMPLIFIER WITH ELECTROSTATIC DISCHARGE PROTECTION

(71) Applicant: Apple Inc., Cupertino, CA (US)

(72) Inventors: Sohrab Emami-Neyestanak, San Francisco, CA (US); Saihua Lin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/147,436

(22) Filed: Sep. 28, 2018

(65) Prior Publication Data
US 2020/0106472 A1 Apr. 2, 2020

(51) Int. Cl.
| H04B 1/48 | (2006.01) |
| H04B 1/04 | (2006.01) |
| H03H 7/40 | (2006.01) |
| H03F 1/56 | (2006.01) |
| H03K 19/0175 | (2006.01) |
| H04B 1/18 | (2006.01) |
| H03F 3/24 | (2006.01) |

(52) U.S. Cl.
CPC ............ *H04B 1/48* (2013.01); *H03F 1/565* (2013.01); *H03H 7/40* (2013.01); *H03K 19/017545* (2013.01); *H04B 1/0458* (2013.01); *H04B 1/18* (2013.01); *H03F 3/245* (2013.01); *H03F 2200/541* (2013.01)

(58) Field of Classification Search
CPC .......... H04B 1/48; H04B 1/0458; H04B 1/18; H03F 1/565; H03H 7/40; H03K 19/017545
See application file for complete search history.

(56) References Cited

U.S. PATENT DOCUMENTS

| 8,498,586 | B2 | 7/2013 | Rofougaran et al. | |
| 8,712,342 | B2* | 4/2014 | Maimon | H04B 1/0458 331/126 |
| 9,031,518 | B2* | 5/2015 | Lin | H04B 1/44 455/78 |
| 9,083,293 | B2 | 7/2015 | Chien et al. | |
| 9,780,828 | B2 | 10/2017 | Afsahi et al. | |
| 2011/0143690 | A1* | 6/2011 | Jerng | H04B 1/44 455/78 |
| 2012/0295556 | A1* | 11/2012 | Chien | H03F 3/72 455/78 |
| 2013/0084915 | A1* | 4/2013 | Asuri | H04B 1/0483 455/552.1 |
| 2014/0273887 | A1* | 9/2014 | Black | H04B 1/40 455/77 |
| 2015/0038101 | A1* | 2/2015 | Maxim | H04B 1/04 455/340 |
| 2017/0250728 | A1* | 8/2017 | Afsahi | H04B 1/44 |

* cited by examiner

*Primary Examiner* — Md K Talukder
(74) *Attorney, Agent, or Firm* — Kowert, Hood, Munyon, Rankin & Goetzel, P.C.

(57) ABSTRACT

A transceiver circuit that includes a receiver and transmitter circuits may send and receive data signals using an antenna. The transceiver circuit may be coupled to the antenna and other circuits using multiple impedance matching networks configured to match input and output impedance values of the receiver and transmitter circuits to the antenna and other circuits. The impedance matching networks may selectively couple and decouple different ports of the receiver and transmitter circuits to other circuit nodes based on whether the transceiver is operating in transmit or receive mode.

16 Claims, 6 Drawing Sheets

BI-DIRECTIONAL AMPLIFIER WITH ELECTROSTATIC DISCHARGE PROTECTION

BACKGROUND

Technical Field

The embodiments described herein generally relate to signal transmission and reception in computer systems, and more particularly, to coupling transceiver circuits to antennas and circuit blocks included in a computer system.

Description of the Relevant Art

Computer systems, such as systems-on-a-chip (SoCs), include processors and multiple memory circuits that store software programs or applications, as well as data being operated on by the processors. Additionally, computer systems may include mixed-signal circuitry for generating timing signals and power supply signals of varying voltage levels. Some computer systems also include input/output circuit to allow transfer of data between different computer systems via a communication link or communication network.

Communication links and communication networks used by computer systems may be either wired or wireless. Input/output circuits designed for use with wired communication links or communication networks transmit digital data bits that have been translated into electrical impulses on one or more wires, circuit board traces, and the like. Such input/output circuits may also receive electrical impulses from the one or more wires, circuit board traces, etc., and convert them into digital data bits for further processing by a processor or other suitable functional circuit block.

Input/output circuits designed to work with wireless communication links and communication networks work in a similar fashion but instead of electrical impulses on a wire or other suitable medium, translate information encoded in electromagnetic waves into digital data bits and vice versa.

SUMMARY OF THE EMBODIMENTS

Various embodiments of a transceiver circuit are disclosed. Broadly speaking, an apparatus and a method are contemplated, in which a first matching network coupled to a receiver circuit and transmitter circuit included in the transceiver circuit is configured to couple an output of the receiver circuit to ground in response to an activation of a transmit mode and inductively couple a transmission signal to an input of the transmitter circuit. A second matching network coupled to the receiver and transmitter circuits is configured to decouple an input of the receiver circuit from a bidirectional port of the transceiver circuit in response to activation of the transmit mode and inductively coupled an output of the transmitter circuit to the bidirectional signal port. In another embodiment, the first matching network includes a series matching network and the second matching network includes a shunt matching network. In another non-limiting embodiment, the first and second matching networks each include a series matching network.

Figure 1:
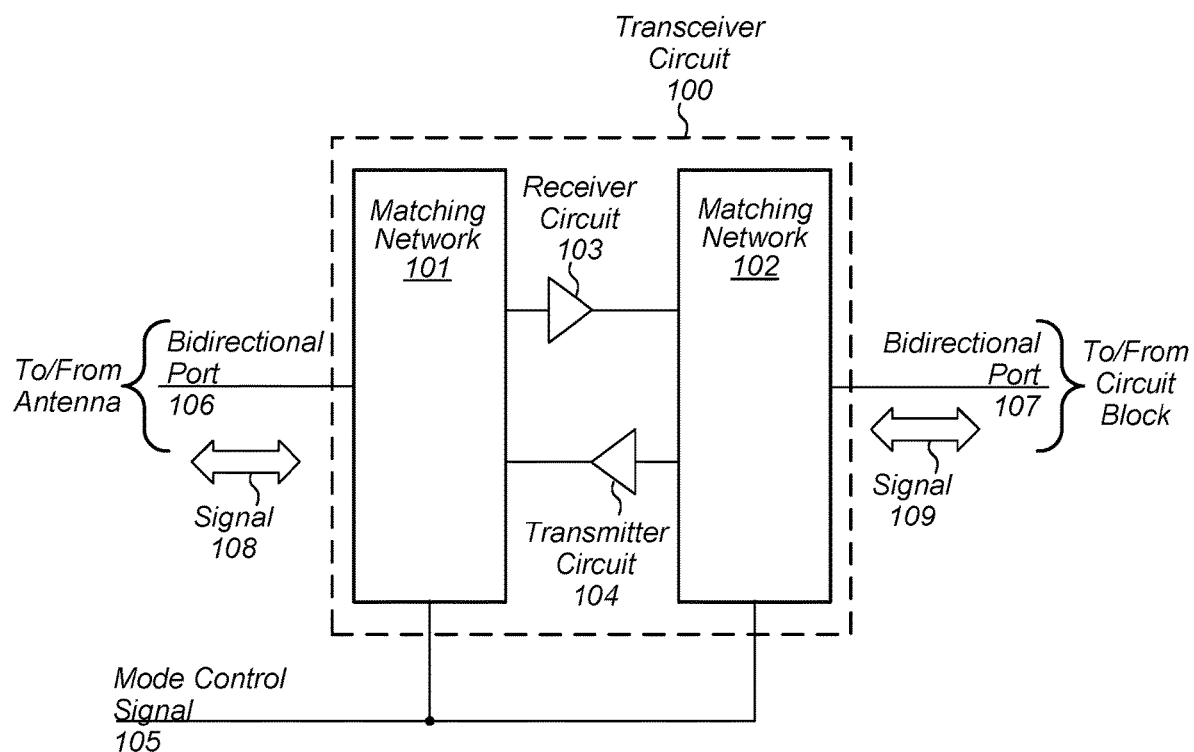
FIG. 1 illustrates a block diagram of an embodiment of transceiver circuit that employs matching networks.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

During operation of a computer system, data may be exchanged with other computer systems via wireless networks or communication links. For example, a mobile computer device, such as a cellular phone, may send and receive both voice and data over a cellular of WiFi network. Additionally, the mobile computer device may communicate with peripheral devices, such as headphones, speakers, and the like, using Bluetooth or any other suitable wireless personal area network.

To allow for the transmission and reception of data, a computer system can employ a time division duplex (TDD) to share a common antenna for both transmission and reception of data. Many computer systems employ transmit/receive (TR) switches that selectively couple either a receiver circuit or a transmitter circuit to the antenna. Such switches can result in large circuit area as well as signal loss at certain millimeter frequencies.

In some computer systems, a phase shifter circuit that is also shared between the receiver and transmitter circuit may be employed. Such sharing results in another set of switches, further increasing the circuit area and likelihood for signal loss or attenuation. The embodiments illustrated in the drawings and described below may provide techniques for implementing the functionality of TR switches using already existing impedance matching networks, thereby reducing the area of the overall transceiver assembly and minimizing signal degradation.

An embodiment of a transceiver circuit is illustrated in FIG. 1. As illustrated, transceiver circuit 100 includes matching network 101, matching network 102, receiver circuit 103 and transmitter circuit 104. Matching network 101 is coupled to bidirectional port 106, an input port of receiver circuit 103, and an output port of transmitter circuit 104. Matching network 102 is coupled to bidirectional port 107, an output port of receiver circuit 103, and an input port of transmitter circuit 104.

In addition to providing an impedance match between a functional circuit block coupled to bidirectional port 107 and receiver circuit 103 and transmitter circuit 104, matching network 102 is configured to couple an output of the receiver circuit to ground in response to an activation of a transmit mode and inductively couple a transmission signal to an input of the transmitter circuit. For example, in response to mode control signal 105 indicating a transmit mode, matching network 101 may couple signal 109 to an input port of transmitter circuit 104 and couple an output port of receiver circuit 103 to ground. As described below in more detail, matching network 101 may include any suitable combination of transformers, inductors, capacitors, and devices (e.g., transistors).

Matching network 101 is, in addition to providing an impedance match between an antenna or other similar structure and receiver circuit 103 and transmitter circuit 104, configured to decouple an input of the receiver circuit from a bidirectional signal port in response to the activation of the transmit mode; and inductively couple an output of the transmitter circuit to the bidirectional signal port. For example, in response to mode control signal 105 indicating the transmit mode, matching network 101 may decouple an input of receiver circuit 103 from bidirectional port 106 and couple an output port of transmitter circuit 104 to bidirectional port 106.

Receiver circuit 103 is configured to receive and amplify signal 108. In some cases, signal 108 may be received via an antenna which is coupled to an input port of receiver circuit 103 via an impedance matching network, such as, matching network 101. In various embodiments, receiver circuit 103 may be a particular embodiment of a radio frequency (RF) amplifier that includes any suitable combination of passive and active circuit elements, such as, capacitors, resistors, transistors, and the like.

Transmitter circuit 104 is configured to receive signal 109 and drive an antenna or other suitable structure using signal 109. In various cases, signal 109 may be received from a functional circuit block, such as a processor, included in a computer system. Transmitter circuit 104 may be coupled to the functional circuit block via a matching network, such as matching network 102, which matches an output impedance of the functional circuit block to an input impedance of the transmitter circuit 104 to maximize power transfer and minimize signal reflections. In a similar fashion, another matching network, such as matching network 101, may match an impedance of an antenna to an output impedance of transmitter circuit 104 to allow for maximum power transfer and minimize signal reflections.

It is noted that by inductively coupling both transmitter circuit 104 and receiver circuit 103 to bidirectional ports 106 and 107, switch circuit are not employed, which reduces the overall area of transceiver circuit, as well as saves the power normally dissipated with the use of such switches. Moreover, as described below in more detail, use of inductive coupling techniques provides paths to ground to dissipate energy associated with electrostatic discharge (ESD) events that could otherwise damage receiver circuit 103 and transmitter circuit 104.

The embodiment depicted in FIG. 1 is merely an example. In other embodiments, different arrangements of circuit elements may be employed. For example, in some embodiments, transmitter circuit 104 may be double-ended, not single-ended as depicted in the embodiment of FIG. 1.

Figure 2:
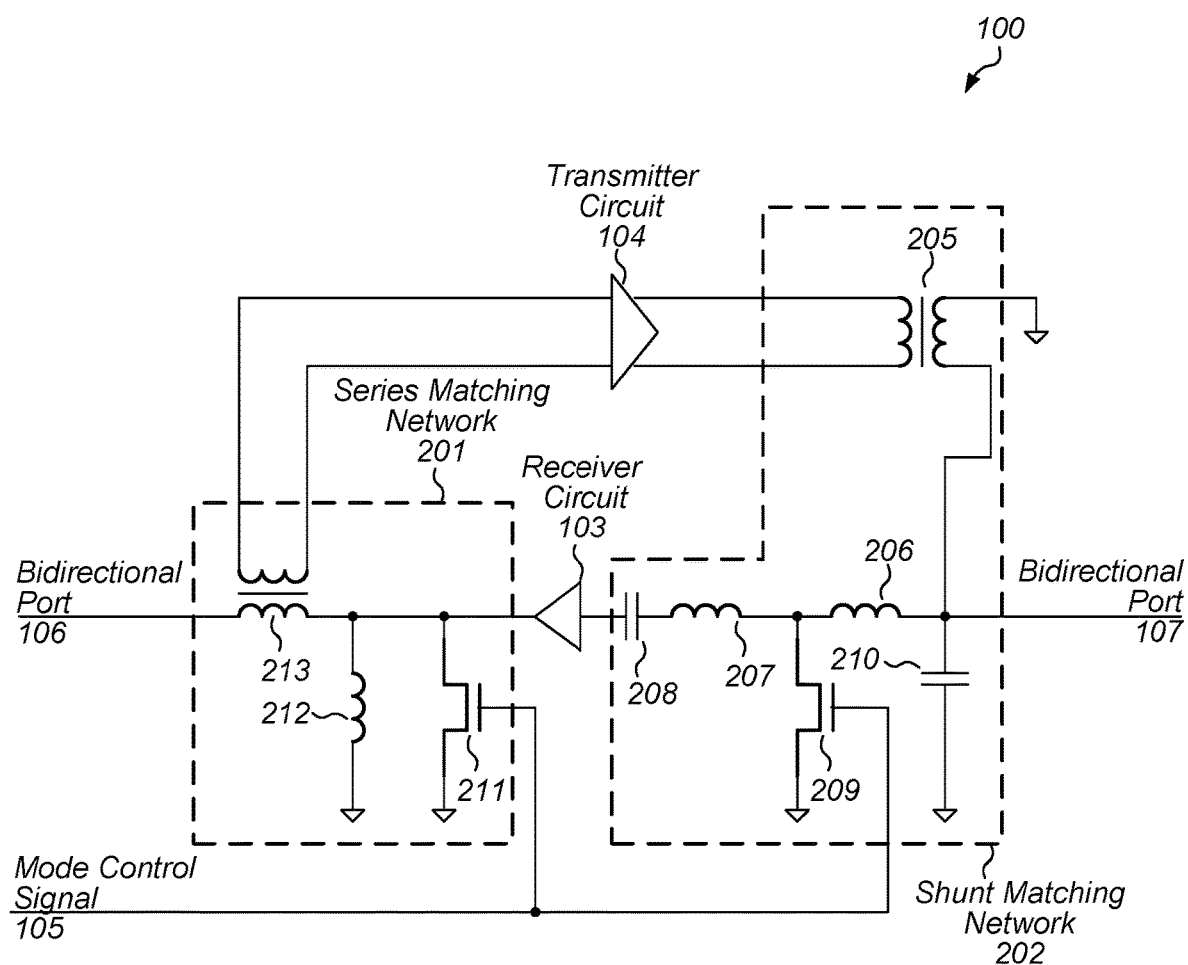
FIG. 2 illustrates a block diagram of an embodiment of a transceiver circuit that employs a series matching network and a shunt matching network.

Turning to FIG. 2, another embodiment of a transceiver circuit that includes two different types of impedance matching networks is illustrated. As depicted, transceiver circuit 100 includes receiver circuit 103, transmitter circuit 104, series matching network 201, and shunt matching network 202.

Series matching network 201 includes transformer 213, inductor 212, and device 211. As used herein, a transformer refers to a pair of mutually coupled inductors. One inductor is commonly referred to as a primary and the other inductor is commonly referred to as a secondary. In various embodiments, additional material located between the inductor may be employed to modify an amount of coupling between the two inductors.

A primary side of transformer 213 is coupled in series between bidirectional port 106 and an output port of receiver circuit 103. It is this series connection from which series matching network 201 derives its name. A secondary side of transformer 213 is coupled across the inputs of transmitter circuit 104. Inductor 212 is coupled between the output port of receiver circuit 103 and ground, and device 211 is also coupled between the output port of receiver circuit 103 and ground. Device 211 is controller by mode control signal 105.

As used and described herein, a device refers to a transconductance circuit element that is configured to regulate an amount of current flowing through the device based on a voltage level of a signal coupled to its control terminal. In various embodiments, a device may include a junction field-effect transistor (JFET), a metal-oxide semiconductor field-effect transistors (MOSFET), or any other suitable type of device. It is noted that other types of device technology, such as bipolar, may be employed.

Shunt matching network 202 includes transformer 205, capacitor 208, inductor 207, device 209, inductor 206, and capacitor 210. Capacitor 208, inductor 207 and inductor 206 are coupled in series between bidirectional port 107 and an input port of receiver circuit 103. Device 209 is coupled between ground and circuit node between inductors 207 and 206, and capacitor 210 is coupled between bidirectional port 107 and ground. A primary side of transformer is coupled between bidirectional port 107 and ground (commonly referred to as a "shunt connection" from which shunt matching network 202 derives its name). A secondary side of transformer 205 is coupled across output terminals of transmitter circuit 104. It is noted that transformers 213 and 205, inductors 212, 207, and 206, capacitors 208 and 210, and devices 209 and 211 may be fabricated on a common integrated circuit, or may be fabricated as discrete circuit components and mounted on a suitable substrate or circuit board.

During transmit mode, mode control signal is at a high logic level, which results in devices 211 and 209 be active and discharging their respective circuit nodes to ground. A signal present at bidirectional port 106 passes through the primary of transformer 213, which couples to the secondary of transformer 213, and into transmitter circuit 104. Transmitter circuit 104 generates, based on the received signal, an output signal which is coupled through transformer 205 to bidirectional port 107. It is noted that in various embodiments, bidirectional port 107 may be coupled to an antenna or other suitable structure used in the generation of electromagnetic signals.

The embodiments illustrated and described herein may employ complementary metal-oxide-semiconductor (CMOS) circuits. In various other embodiments, however, other suitable technologies may be employed. For the sake of clarity, it is noted that "high," "high level" or "high logic level" refers to a voltage sufficiently large to turn on a n-channel MOSFET and turn off a p-channel MOSFET, while "low," "low level," or "low logic level" refers to a voltage that is sufficiently small enough to do the opposite. In other embodiments, different technology may result in different voltage levels for "low" and "high."

Since mode control signal 105 is high, device 209 discharges the circuit node between inductors 207 and 206 to ground. This allows inductor 206 to resonant with capacitor 210 at a frequency of the transmitted signal. With inductor 206 and capacitor 210 resonating, a load associated with receiver circuit 103 on the output of transmitter circuit 104 and bidirectional port 107 is minimized.

It is noted that in the shunt configuration depicted in shunt matching network 202, a side of transformer 205 coupled to bidirectional port 107 is also coupled to ground. This type of connection provides electrostatic discharge (ESD) protection for bidirectional port 107. The side of transformer 205 coupled to ground provides a path to ground for excess energy applied to bidirectional port 107 during an ESD event, thereby protecting the other circuit components in transceiver circuit 100.

During receive mode, mode control signal is at a low logic level, which deactivates devices 211 and 209. The inductors included in transformer 205 are inductive at the frequency of a signal received via bidirectional port 107, which causes capacitor 210 to resonant with the inductors of transformer 205 at the frequency of the received signal, thereby reducing a loading impact of transmitter circuit 104 on bidirectional port 107 and the input of receiver circuit 103.

In some cases, the frequency of the received signal and a transmitted signal are substantially the same, which results in an impedance looking into transformer 205 to be similar to the impedance through inductor 206. The series combination of inductors 206 and 207 form a larger inductor used to match the impedance of receiver circuit 103 with that of a load, such as an antenna, or bidirectional port 107.

At the output port of receiver circuit 103, the combination of inductor 212 and the primary of transformer 213 provide an impedance match between the output of receiver circuit 103 and a load, such as a functional circuit block, coupled to bidirectional port 106. It is noted that the secondary of transformer 213 may approximate an open circuit for the receive signal path. In some embodiments, inductor 212 may provide ESD protection, in a similar fashion to the side of transformer 205 coupled to ground, and may be omitted in bidirectional port 106 is not susceptible to ESD events.

It is noted that the embodiment depicted in FIG. 2 is merely an example. In other embodiments, different types of passive circuit components, and different types of active circuit components may be employed in either of series matching network 201 and shunt matching network 202.

Figure 3:
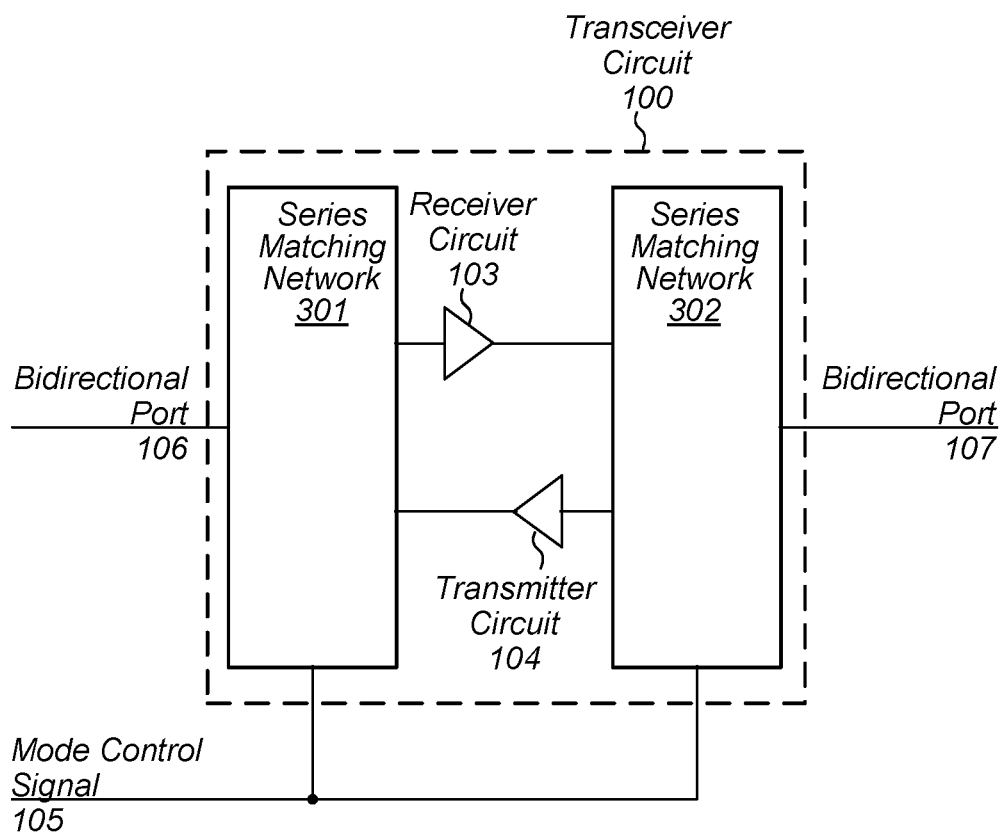
FIG. 3 illustrates a block diagram of an embodiment of a transceiver circuit that employs multiple series matching networks.

As illustrated in FIG. 2, a transceiver circuit may employ two different types of matching networks. In some cases, however, different constraints, such as form factor, performance requirements, and the like, may dictate different arrangements of matching networks. An embodiment of a transceiver circuit that uses two series matching networks is illustrated in FIG. 3.

In the illustrated embodiment, transceiver circuit 100 includes series matching network 301, series matching network 302, receiver circuit 103 and transmitter circuit 104. In various embodiments, series matching networks 301 and 302 may correspond to series matching network 201 as illustrated in the embodiment of FIG. 2. It is noted that series matching network 301 and series match network 302 may include different logic gates or other circuitry to allow each of them to operate differently from each other.

Series matching network 301 is coupled to bidirectional port 106, as well as an input port of receiver circuit 103 and an output port of transmitter circuit 104. In some cases, bidirectional port 106 may be additionally coupled to an antenna or other suitable structure for the transmission and reception of electromagnetic signals.

Series matching network 302 is coupled to bidirectional port 107 as well as an output port of receiver circuit 103 and an input port of transmitter circuit 104. As described above, bidirectional port 107 may additionally be coupled to a functional circuit block that provides data to be transmitted. The functional circuit block, or another suitable functional circuit block in the computer system, may also be a recipient of data received via bidirectional port 106.

When a state of mode control signal 105 is indicative of a transmit mode, shunt matching network 401, series matching network 302 may couple the output port of receiver circuit 103 to ground and inductively couple bidirectional port 107 to the input port of transmitter circuit 104. Additionally, series matching network 302 may couple the input port of receiver circuit 103 to ground and inductively couple the output port of transmitter circuit 104 to bidirectional port 106. With both series matching network 301 and series matching network 302 operating as described, an impedance matched path is provided from bidirectional port 107, through transmitter circuit 104, to bidirectional port 106 to allow transmission of data.

When the state of mode control signal 105 is indicative of a receive mode, series matching network 301 will couple bidirectional port 106 to the input port of receiver circuit 103 and, through the use of a resonant circuit, reduce the loading of the output port of transmitter circuit 104 on bidirectional port 106. In a similar fashion, series matching network 302 couples the output port of receiver circuit 103 to bidirectional port 107 and minimizes the loading of the input port of transmitter circuit 104 on bidirectional port 107 using a resonant circuit. With both series matching networks 301 and 302 operating in receive mode, a signal is received via bidirectional port 106, amplified by receiver circuit 103, and an amplified various of the received signal output on bidirectional port 107 for consumption by other functional circuit blocks.

It is noted that the embodiment illustrated in FIG. 3 is merely an example and that the series matching networks included in transceiver circuit may include different circuit elements and different combination of circuit elements than series matching network 201 as illustrated in FIG. 2.

Figure 4:
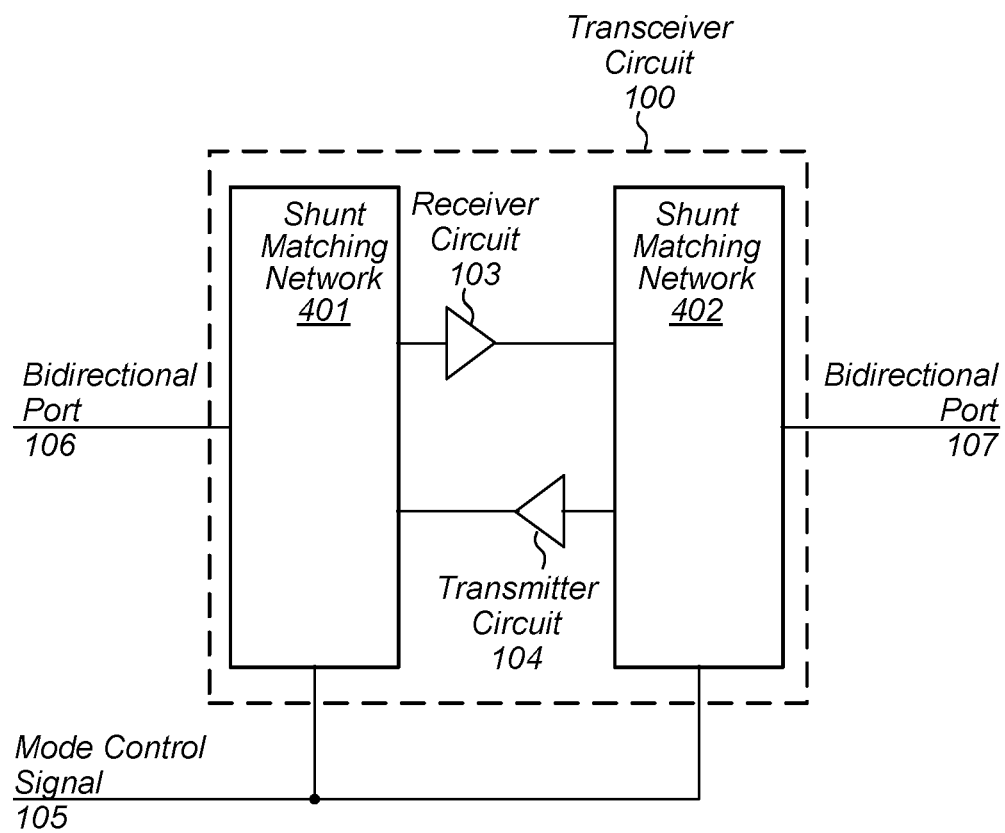
FIG. 4 illustrates a block diagram of an embodiment of a transceiver circuit that employs multiple shunt matching networks.

Just as two series matching networks may be used in a transceiver circuit, in other cases, two shunt matching networks may also be employed. A block diagram of an embodiment of a transceiver circuit employing two shunt networks is illustrated in FIG. 4.

As illustrated, transceiver circuit 100 includes shunt matching network 401, shunt matching network 402, receiver circuit 103 and transmitter circuit 104. In various embodiments, shunt matching networks 401 and 402 may correspond to shunt matching network 202 as illustrated in the embodiment of FIG. 2.

Shunt matching network 401 received mode control signal 105 and is coupled to bidirectional port 106, an input port of receiver circuit 103, and an output port of transmitter circuit 104. Shunt matching network 401 also receives mode control signal 105 and is coupled to bidirectional port 107, an output port of receiver circuit 103, and an input port of transmitter circuit 104. It is noted that each or shunt matching network 401 and 402 may include additional logic gates or other circuitry to allow them to function differently from each other during transmit and receive mode operation.

When a state of mode control signal 105 is indicative of a transmit mode, shunt matching network 401, shunt matching network 402 may couple the output port of receiver circuit 103 to ground and inductively couple bidirectional port 107 to the input port of transmitter circuit 104. Additionally, shunt matching network 402 may couple the input port of receiver circuit 103 to ground and inductively couple the output port of transmitter circuit 104 to bidirectional port 106. With both shunt matching network 401 and shunt matching network 402 operating as described, an impedance matched path is provided from bidirectional port 107, through transmitter circuit 104, to bidirectional port 106 to allow transmission of data.

When the state of mode control signal 105 is indicative of a receive mode, shunt matching network 401 will couple bidirectional port 106 to the input port of receiver circuit 103 and, through the use of a resonant circuit, reduce the loading of the output port of transmitter circuit 104 on bidirectional port 106. In a similar fashion, shunt matching network 402 couples the output port of receiver circuit 103 to bidirectional port 107 and minimizes the loading of the input port of transmitter circuit 104 on bidirectional port 107 using a resonant circuit. With both shunt matching networks 401 and 402 operating in receive mode, a signal is received via bidirectional port 106, amplified by receiver circuit 103, and an amplified various of the received signal output on bidirectional port 107 for consumption by other functional circuit blocks.

It is noted that the embodiment in FIG. 4 is merely an example. In other embodiments, different types and arrangements of matching networks may be employed.

Figure 5:
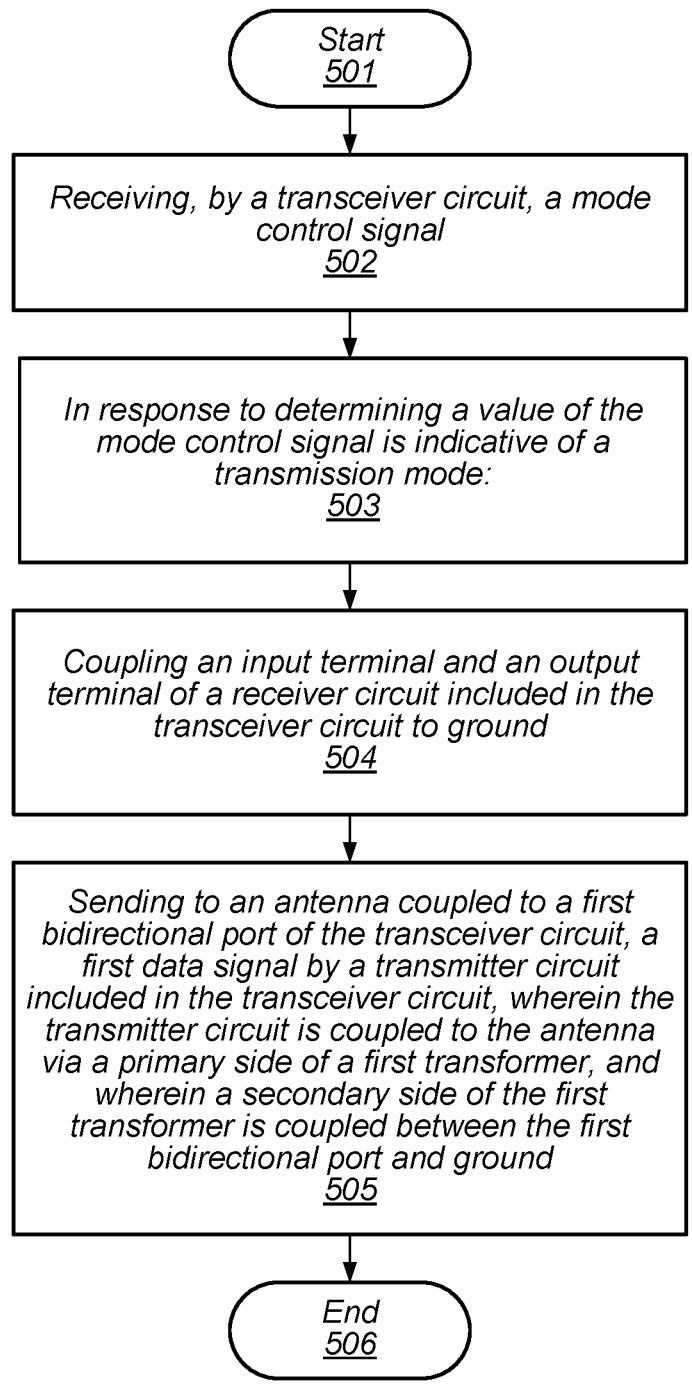
FIG. 5 illustrates a flow diagram depicting an embodiment of a method for operating a transceiver circuit.

Turning to FIG. 5, a flow diagram depicting an embodiment of a method for operating a transceiver circuit is illustrated. The method, which may be applied to transceiver circuit 100 or any other suitable transceiver circuit, begins in block 501.

The method includes receiving, by a transceiver circuit, a mode control signal (block 502). For example, transceiver circuit 100 receives mode control signal 105, the value of which is indicative of a particular mode of operation of transceiver circuit 100. A high logic value on mode control signal 105 may activate a transmission mode where transceiver circuit 100 sends a data signal received from a circuit block to the antenna. Alternatively, a low logic value on mode control signal 105 may activate a receive mode, in which transceiver circuit 100 receives a data signal from the antenna and relays an amplified version of the received data signal to a circuit block.

The method further includes, in response to determining a value of the mode control signal is indicative of a transmission mode (block 503), coupling an input terminal and an output terminal of a receiver circuit included in the transceiver circuit to ground (block 504). The method also includes sending, to an antenna coupled to a first bidirectional port of the transceiver circuit, a first data signal by a transmitter circuit included in the transceiver circuit (block 505). As described above, the transmitter circuit is coupled to the antenna via a primary side of a first transformer, and the secondary side of the first transformer is coupled between the first bidirectional port and ground.

Additionally, the method includes receiving the first data signal from an external circuit coupled to a second bidirectional port of the transceiver circuit, and inductively coupling the first data signal to one or more input terminals of the transmitter circuit using a second transformer. As described above, the transceiver circuit is coupled to the external circuit using a transformer. Data signals are driven into a primary side of the transformer. As current flowing in the primary side of the transformer changes in response to voltage changes associated with the data signals, a current indicative of the data signals is induced in a secondary side of the transfer by the magnetic field within the transformer.

As described above, the transceiver circuit is capable of both sending and receiving data depending on a state of the mode control signal. The method includes, in response to determining the value of the mode control signal is indicative of a receive mode: matching an impedance of the antenna to an input impedance of the receiver circuit using a shunt matching network, matching an impedance of an external circuit coupled to transceiver circuit to an output impedance of the receiver using a series matching network, receiving, by the receiver circuit, a second data signal via the antenna, and amplifying the second data signal by the receiver circuit to generate an output signal.

When matching the input impedance of the receiver circuit to the antenna, the method further includes coupling the input terminal of the receiver circuit to then antenna using at least one inductor and at least one capacitor coupled in series. Additionally, when matching an impedance of the external circuit coupled to transceiver circuit to the output impedance of the receiver circuit, the method includes coupling an output terminal of the receiver circuit to ground using an inductor, and coupling the output terminal of the receiver circuit to a second bidirectional port of the transceiver circuit using a primary side of a second transformer, wherein the second bidirectional port is coupled to the external circuit.

In some cases, a frequency at which a data signal is transmitted is the same as a frequency at which a different data signal is received. In such cases, the method includes sending, to the antenna, the first data signal by a transmitter circuit at a particular frequency, and receiving, by the receiver circuit, the second data signal at the particular frequency. The method concludes in block 506.

It is noted that the embodiment of the method depicted in FIG. 5 is merely an example. In other embodiments, different operations and different orders of operations are possible and contemplated.

Figure 6:
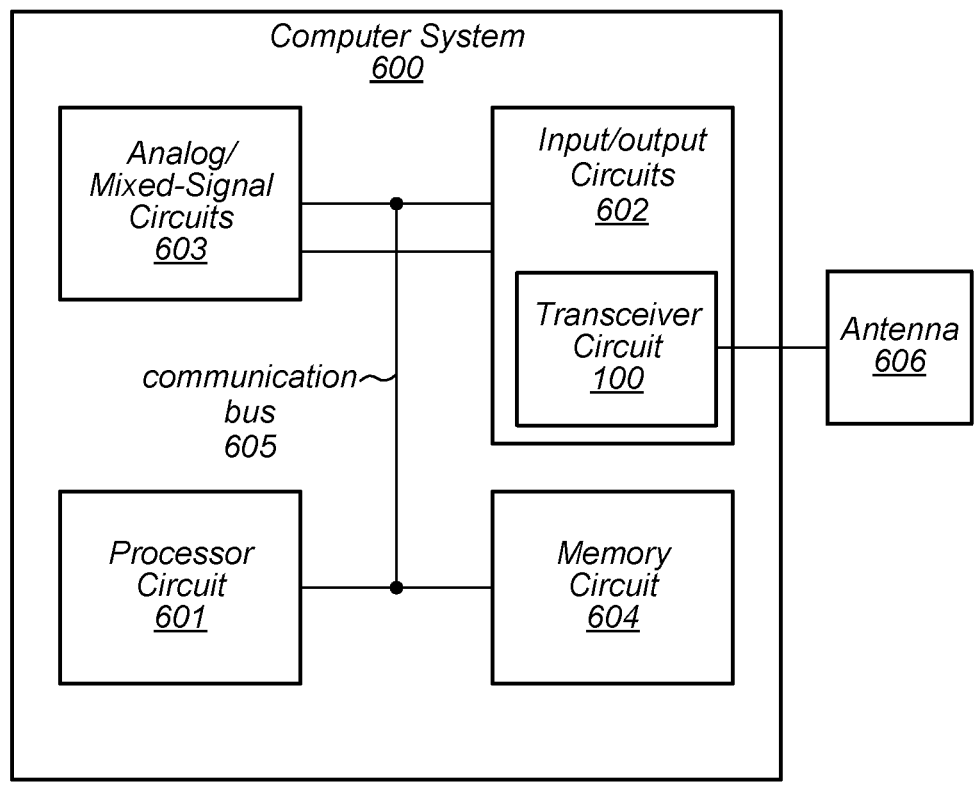
FIG. 6 illustrates a generalized block diagram of a computer system that includes a transceiver circuit.

A block diagram of computer system is illustrated in FIG. 6. As illustrated, the computer system 600 includes, processor circuit 601, input/output circuits 602, analog/mixed-signal circuits 603, and memory circuit 604, each of which may be configured to send requests and data (collectively transactions) the other circuit blocks using communication bus 605. In various embodiments, computer system 600 may be configured for use in a desktop computer, server, or in a mobile computing application such as, e.g., a tablet, laptop computer, or wearable computing device. Although four circuit blocks are depicted in the embodiment of FIG. 6, in other embodiments, any suitable number of circuit blocks may be included in computer system 600. It is noted that the individual circuit blocks included in computer system 600 may be fabricated on a common substrate as a system on a chip (or "SoC"). Alternatively the individual circuit blocks may be fabricated as respective integrated circuits, which are coupled together using a common substrate, circuit board, or other suitable methods.

Processor circuit 601 may, in various embodiments, be representative of a general-purpose processor that performs computational operations. For example, processor circuit 601 may be a central processing unit (CPU) such as a microprocessor, a microcontroller, an application-specific integrated circuit (ASIC), or a field-programmable gate array (FPGA).

Memory circuit 604 may include any suitable type of memory such as a Dynamic Random-Access Memory (DRAM), a Static Random-Access Memory (SRAM), a Read-only Memory (ROM), Electrically Erasable Programmable Read-only Memory (EEPROM), or a non-volatile memory, for example. It is noted that in the embodiment illustrated in FIG. 6, a single memory circuit is depicted. In other embodiments, any suitable number of memory circuits may be employed.

Analog/mixed-signal circuits 603 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal circuits 603 may be configured to perform power management tasks with the inclusion of on-chip power supplies and voltage regulators.

Input/output circuits 602, which includes transceiver circuit 100, may be configured to coordinate data transfer between computer system 600 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 602 may be configured to implement a version of Universal Serial Bus (USB) protocol or IEEE 1394 (Firewire®) protocol.

Input/output circuits 602 may also be configured to coordinate data transfer between computer system 600 and one or more devices (e.g., other computing systems or integrated circuits) coupled to computer system 600 via a wired network. Alternatively, as described above, input/output circuits 602 may employ transceiver circuit 100 to perform data transfer, using antenna 606, over a wireless network. In one embodiment, input/output circuits 602 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 602 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a first matching network coupled to a receiver circuit and a transmitter circuit, wherein the first matching network is configured to:
        couple an output of the receiver circuit to ground in response to an activation of a transmit mode; and
        inductively couple a transmission signal to an input of the transmitter circuit; and
    a second matching network coupled to the receiver circuit and the transmitter circuit, wherein the second matching network includes:
        a first transformer, wherein a first terminal of a primary side of the first transformer is coupled between a first bidirectional port and ground, and wherein at least one terminal of a secondary side of the first transformer is coupled to a corresponding output of the transmitter circuit;
        a first inductor coupled to the first bidirectional port; and
        a first device coupled to the first inductor and an input of the receiver circuit by at least a second inductor, wherein the first device is configured to couple a terminal of the second inductor to ground in response to the activation of the transmit mode;
    wherein the second matching network is configured to:
        decouple an input of the receiver circuit from the first bidirectional port in response to the activation of the transmit mode; and
        inductively couple an output of the transmitter circuit to the first bidirectional port.

2. The apparatus of claim 1, wherein the second matching network is configured to, in response to an activation of a receive mode, match an impedance of an antenna to an input impedance of the receiver circuit, and wherein the first matching network is further configured to, in response to the activation of the receive mode, match an impedance of an external circuit coupled to the transmitter circuit to an output impedance of the receiver circuit, and receive, a second data signal via the antenna.

3. The apparatus of claim 1, wherein the first matching network includes a first series matching network and the second matching network includes a second series matching network.

4. The apparatus of claim 1, wherein the first matching network includes a first shunting network and the second matching network includes a second shunt matching network.

5. The apparatus of claim 1, wherein the first matching network includes:
 a second transformer, wherein a first terminal of a primary side of the second transformer is coupled to a second bidirectional signal port and a second terminal of the primary side of the second transformer is coupled to the output of the receiver circuit; and
 a second device coupled to the output of the receiver circuit, wherein the second device is configured to couple, in response to the activation of the transmit mode, the output of the receiver circuit to ground.

6. The apparatus of claim 5, wherein the first matching network further includes a third inductor coupled between the second terminal of the second transformer and ground, and wherein at least one terminal of a secondary side of the second transformer is coupled to a corresponding input of the transmitter circuit.

7. The apparatus of claim 2, wherein the antenna is coupled to the first bidirectional port.

8. The apparatus of claim 1, wherein the second matching network further includes a first capacitor coupled between the first bidirectional port and ground.

9. A method, comprising: in response to activating a transmit mode for a transceiver circuit that includes a transmitter circuit, a receiver circuit, a first matching network, and a second matching network:
 coupling an output of the receiver circuit to ground using a first device included in the first matching network;
 decoupling, by the second matching network, an input of the receiver circuit from a first bidirectional port;
 coupling the input of the receiver circuit to ground using a second device
 coupled to the input of the receiver circuit via a first inductor, wherein the second device and the first inductor are included in the second matching network;
 coupling the first bidirectional port to the second device using a second inductor included in the second matching network;
 inductively coupling a transmission signal to an input of the transmitter circuit using a first transformer included in the first matching network; and
 inductively coupling, using a second transformer included in the second matching network, an output of the transmitter circuit to the first bidirectional port of the transceiver circuit, wherein a first terminal of a primary side of the second transformer is coupled between the first bidirectional port and ground, and wherein at least one terminal of a secondary side of the second transformer is coupled to a corresponding output of the transmitter circuit.

10. The method of claim 9, further comprising, in response to activating a receive mode for the transceiver circuit:
 matching an impedance of an antenna to an input impedance of the receiver circuit, wherein the antenna is coupled to the receiver circuit via the first bidirectional port; and
 matching an impedance of an external circuit to an output impedance of the receiver circuit, wherein the external circuit is coupled to the transmitter circuit via a second bidirectional port of the transceiver circuit.

11. The method of claim 10, wherein matching the impedance of the antenna to the input impedance of the receiver circuit includes coupling the first bidirectional port to ground using a parallel combination of a capacitor and the primary side of the second transformer, wherein the capacitor is included in the second matching network.

12. The method of claim 10, wherein matching the impedance of the external circuit to the output impedance of the receiver circuit includes:
 coupling the output of the receiver circuit to ground using a third inductor included in the first matching network; and
 coupling the output of the receiver circuit to the second bidirectional port using a primary side of the first transformer.

13. An apparatus, comprising:
 a processor circuit;
 an antenna; and
 a transceiver circuit that includes a transmitter circuit, a receiver circuit, a first matching network, and a second matching network, wherein the transceiver circuit is coupled to the processor circuit and the antenna, and wherein the transceiver circuit is configured, in response to the processor circuit activating a transmit mode, to:
 couple an output of the receiver circuit to ground using a first device included in the first matching network;
 decouple an input of the receiver circuit from a first bidirectional port using the second matching network;
 couple the input of the receiver circuit to ground using a second device coupled to the input of the receiver circuit via a first inductor, wherein the second device and the first inductor are included in the second matching network;
 couple the first bidirectional port to the second device using a second inductor included in the second matching network;
 inductively couple a transmission signal to an input of the transmitter circuit using a first transformer included in the first matching network; and
 inductively couple, using a second transformer included in the second matching network, an output of the transmitter circuit to the first bidirectional port of the transceiver circuit, wherein a first terminal of a primary side of the second transformer is coupled between the first bidirectional port and ground, and wherein at least one terminal of a secondary side of the second transformer is coupled to a corresponding output of the transmitter circuit, and wherein the first bidirectional port is coupled to the antenna.

14. The apparatus of claim 13, therein the transceiver circuit is further configured, in response to the processor circuit activating a receive mode, to:
 match an impedance of the antenna to an input impedance of the receiver circuit, wherein the antenna is coupled to the receiver circuit via the first bidirectional port; and
 match an impedance of an external circuit to an output impedance of the receiver circuit, wherein the external circuit is coupled to the transmitter circuit via a second bidirectional port of the transceiver circuit.

15. The apparatus of claim 14, wherein to match the impedance of the antenna to the input impedance of the receiver circuit, the transceiver circuit is further configured to couple the first bidirectional port to ground using a parallel combination of a capacitor and a the primary side of the second transformer, wherein the capacitor is included in the second matching network.

16. The apparatus of claim 14, wherein to match the impedance of the external circuit to the output impedance of the receiver circuit, the transceiver circuit is further configured to:
- couple the output of the receiver circuit to ground using a third inductor included in the first matching network; and
- couple the output of the receiver circuit to the second bidirectional port using a primary side of the first transformer.

\* \* \* \* \*